United States Patent
Thompson et al.

(10) Patent No.: US 10,320,596 B2
(45) Date of Patent: Jun. 11, 2019

(54) SYSTEM AND METHOD FOR MODULATING FILTER COEFFICIENTS IN A CHANNELIZER

(71) Applicant: Raytheon Company, Waltham, MA (US)

(72) Inventors: Daniel Thompson, Hermosa Beach, CA (US); Harry B. Marr, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/721,467

(22) Filed: Sep. 29, 2017

(65) Prior Publication Data

US 2019/0104002 A1 Apr. 4, 2019

(51) Int. Cl.
*H04B 1/10* (2006.01)
*H04B 3/14* (2006.01)
*H04B 10/2507* (2013.01)
*H04L 27/12* (2006.01)
*H04B 7/005* (2006.01)

(52) U.S. Cl.
CPC .............. *H04L 27/122* (2013.01); *H04B 1/10* (2013.01); *H04B 3/14* (2013.01); *H04B 3/148* (2013.01); *H04B 7/005* (2013.01); *H04B 10/25073* (2013.01)

(58) Field of Classification Search
USPC .. 375/229–236, 219, 220, 222, 240, 240.26, 375/240.29, 292, 346, 350, 343
See application file for complete search history.

(56) References Cited

U.S. PATENT DOCUMENTS

| | | | | |
|---|---|---|---|---|
| 5,394,110 A | * | 2/1995 | Mizoguchi | ........ H04L 25/03038 329/304 |
| 6,393,451 B2 | * | 5/2002 | Leyonhjelm | .............. H04L 5/06 708/405 |
| 7,164,741 B2 | * | 1/2007 | Harris | .................. H04B 1/7093 370/342 |
| 8,831,121 B1 | | 9/2014 | Qi et al. | |
| 8,958,510 B1 | | 2/2015 | Harris | |
| 9,503,284 B2 | | 11/2016 | Nazarathy et al. | |
| 9,749,007 B1 | * | 8/2017 | Martin | ................... H04B 1/719 |
| 9,923,549 B2 | * | 3/2018 | Kultran | .................. H03H 19/00 |

(Continued)

OTHER PUBLICATIONS

Long, Brian Matthew, Multiple Bandwidth Tree Based Channelizer, A Thesis Presented to the Faculty of San Diego State University, 2011, 63 pages at http://sdsu-dspace.calstate.edu/bitstream/handle/10211.10/1130/Long_Brian.pdf?sequence=1.

(Continued)

*Primary Examiner* — Linda Wong
(74) *Attorney, Agent, or Firm* — Lewis Roca Rothgerber Christie LLP (57) ABSTRACT

Circuit and method for modulating filter coefficients of a frequency channelizer having a filter bank include: receiving a wide spectrum input signal; modulating the filter coefficients of the filter bank to sweep a center frequency of each channel of the frequency channelizer, using a modulation scheme; and inputting frequency offset compensation caused by the modulation, and output signals of the frequency channelizer to an application processing circuit to convert the output signals to their original center frequencies.

20 Claims, 6 Drawing Sheets

(56) References Cited

U.S. PATENT DOCUMENTS

| | | | | |
|---|---|---|---|---|
| 2006/0049977 A1* | 3/2006 | Vacanti | ............... | G01S 7/006 342/121 |
| 2011/0260898 A1* | 10/2011 | Velazquez | ............. | H03F 1/3247 341/110 |
| 2011/0268169 A1* | 11/2011 | Mitsugi | ............... | H04L 25/0212 375/226 |
| 2014/0153920 A1* | 6/2014 | Mo | ............... | H04B 10/697 398/29 |
| 2017/0012596 A1* | 1/2017 | Harris | ............... | H03H 17/0266 |
| 2018/0083661 A1* | 3/2018 | Emadi | ............... | H04B 1/1036 |

OTHER PUBLICATIONS

Abu-Al-Saud, et al. "Efficient Wideband Channelizer for Software Radio Systems Using Modulated PR Filterbanks", IEEE Transactions on Signal Processing, vol. 52, No. 10, Oct. 1, 2004 (pp. 2807-2820).

Plaza, et al. "Theory and Performance of Adaptive IIR Filterbanks With Variable Center Frequencies", Signals, Systems and Computers, 1993. 1993 Conference Record of the Twenty-Seventh Asilomar Conference on Pacific Grove, CA, USA 1-3 Nov. 1, Los Alamitos, CA, USA, IEEE Comput. Soc., Nov. 1, 1999 (pp. 1543-1547).

Zhao, et al. "An Adaptive Filter Bank Implementation of Adaptive IIR Filters", Signals, Systems and Computers, 1992. 1992 Conference Record of the Twenty-Sixth Asilomar Conference on Pacific Grove, CA, USA 26-28 Oct. 1, Los Alamitos, CA USA, IEEE Comput. Soc., US. Oct. 26, 1992 (pp. 841-845).

International Search Report for corresponding International Application No. PCT/US2018/044420, filed Jul. 30, 2018, International Search Report dated Oct. 18, 2018 and dated Oct. 26, 2018 (5 pgs.).

Written Opinion of the International Searching Authority for corresponding International Application No. PCT/US2018/044420, filed Jul. 30, 2018, Written Opinion of the International Searching Authority dated Sep. 19, 2018 (8 pgs.).

* cited by examiner

SYSTEM AND METHOD FOR MODULATING FILTER COEFFICIENTS IN A CHANNELIZER

FIELD OF THE INVENTION

The disclosed invention generally relates to signal processing and electronic circuits and more particularly to system and method for modulating filter coefficients in a channelizer.

BACKGROUND

Digital wideband architectures are useful for high speed digital communication technology. Herein, the term wideband may be used to refer to bandwidths from kilohertz (KHz) to multi-gigahertz (GHz) bandwidths. Channelized architectures become necessary when the bandwidth of the signals being considered are a multiple of the speed of digital logic to process the signals. A channelizer is a circuit implementing a process, which selects a certain frequency band from a wideband input signal. The input signal typically has a higher sample rate than the sample rate of the selected channel. A typical approach to select a channel from an input signal, is to first shift the frequency of input signal by multiplying it with a complex sinusoid, then pass the signal through a low pass filter and alternatively a decimator (rate changer).

Channelized radio receivers divide an incoming radio frequency signal into plural frequency-segregated segments for performing differing signal processing of the output signal in different channels, the physical separation of hardware relating to different channels, reduction of data rate per channel, and the preclusion of cross channel interference effects, among others. In such typical channelization techniques, a frequency and a channel must be calculated and specified for each signal.

Figure 1:
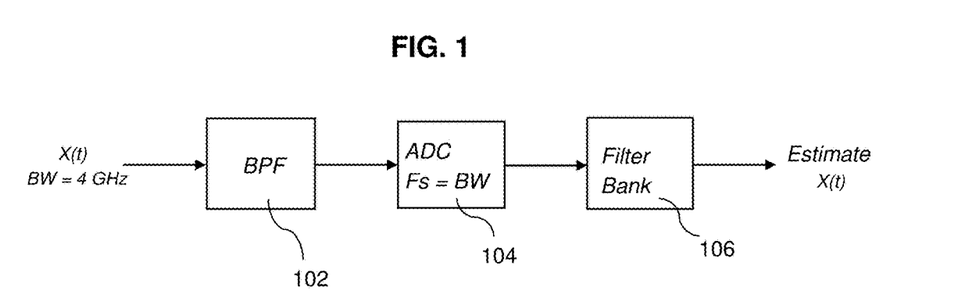
FIG. 1 shows a conventional wideband channelized receiver using full Nyquist sampling rate.

FIG. 1 shows a conventional channelized receiver. As shown, a wide band input analog signal X(t), with a frequency of, for example 4 GHz, is input to an optional anti-aliasing filter 102 to reject signals outside of the band of interest. The anti-aliasing BPF 102 filter attenuates signals outside of the spectrum of interest. A full Nyquist rate analog-to-digital converter (ADC) 104 with a sampling frequency Fs, equal to or greater than the Nyquist frequency of the input signal, samples the output of the anti-aliasing filter 102, converting the analog signal to a digital signal. The output of the ADC 104 is then channelized by a (fixed resolution) filter bank 106. The full Nyquist rate ADC 104 samples the entire signal spectrum of interest. Sampled data are separated via the fixed filter 106 bandwidth. The filter bank 106 decomposes the wideband signal into equally spaced partitions. An example of a channelizing filter bank is a polyphaser, which splits an input signal into a given number N (mostly a power of 2) of equidistant sub-bands. These sub-bands are then subsampled by a factor of N, so they are critically sampled.

Some approaches use the above-described conventional channelized receiver followed by compressive sensing to unwrap the aliased narrow-band spectrum resulting from under sampling. This approach works well for detection of sparse (narrow-band) signals across the wide band of interest. Compressive sensing takes advantage of the fact that a signal can be sparsely represented in a transformed domain (e.g., when a sinusoidal or cosine signal is transformed to Fourier domain by applying the Fourier transform, it can be represented by just two coefficients.). Many signals can be sparsely represented in a transformed domain and thus contain many coefficients in that domain close to or equal to zero (e.g., Fourier or Wavelet). The approach typically starts with taking a weighted linear combination of samples (compressive measurements) using a set of basis functions that are different from the set of basis functions in which the signal is known to be sparse.

A critically sampled channelizer contains spectrum gaps (blind spots), which are the energy differences between the ground state and first excited state of the channelizer. If any of the signal samples fall within these spectrum gaps, that sample cannot be detected and recovered. To reduce these gaps, some approaches oversample the input signal to substantially increase the frequency of the samples to fill the gaps between the channels in the channelized spectrum and therefore minimize the chances of data being lost in the spectrum gaps. This way, signals at the channel boundaries are detected in multiple channels. However, these oversampling approaches create substantially more data which takes more processing power and memory space resulting in more complex and expensive channelizers. Similarly, critically sampled or undersampled channelizers use less resources, but also have gaps in the spectrum, which may also lead to loss of data.

SUMMARY

In some embodiments, the disclosed invention is a method for modulating filter coefficients of a frequency channelizer including a filter bank. The method includes: receiving a wide spectrum input signal; modulating the filter coefficients of the filter bank to sweep a center frequency of each channel of the frequency channelizer, using a modulation scheme; and inputting frequency offset compensation caused by the modulation, and output signals of the frequency channelizer to an application processing circuit to convert the output signals to their original center frequencies.

In some embodiments, the disclosed invention is a circuit for modulating filter coefficients of a frequency channelizer including a filter bank. The circuit includes: an input port for receiving a wide spectrum input signal; a modulation generation circuit for modulating the filter coefficients of the filter bank to sweep a center frequency of each channel of the frequency channelizer, using a modulation scheme; and an application processing circuit for converting output signals of the frequency channelizer to their original center frequencies responsive to frequency offset compensation caused by the modulation generation circuit.

In some embodiments, the disclosed invention is a frequency channelizer comprising: an input port for receiving a wide spectrum input signal; a filter bank including a plurality of filter coefficients; a modulation generation circuit for modulating the filter coefficients of the filter bank to sweep a center frequency of each channel of the frequency channelizer, using a modulation scheme; and an application processing circuit for converting output signals of each channel to their original center frequencies responsive to frequency offset compensations caused by the modulation generation circuit.

In some embodiments, the disclosed invention may include a decision update circuit for updating the modulation scheme and selecting the filter coefficients of the filter bank, based on the output signals of the frequency channelizer. In some embodiments, the decision update circuit updates the modulation scheme and selects the filter coefficients based on the amplitude levels of the signals being detected at the output of the frequency channelizer. In some embodiments, the disclosed invention may include a down-sampler for down-sampling the output signals of the frequency channelizer before being input to the application processing circuit.

BRIEF DESCRIPTION OF THE DRAWINGS

A more complete appreciation of the disclosed invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

The disclosed invention will now be described more fully with reference to the accompanying drawings, in which exemplary embodiments thereof are shown. The disclosed invention may, however, be embodied in many different forms and should not be construed as being limited to the embodiments set forth herein. Rather, these embodiments are provided so that this disclosure is thorough and complete, and will fully convey the concept of the disclosed invention to those skilled in the art. In some embodiments, the method of the disclosed invention is performed by an electronic circuit to transform a high bandwidth analog signal to a plurality of digital signals representing the analog signal. In some embodiments, the method of the disclosed invention is performed by an electronic circuit and a processor, such as a digital signal processor.

In some embodiments, the disclosed invention is a system and method for modulating filter parameters in a critically, over, or under sampled channelizer to ensure full spectrum coverage. For example, a 2× oversampling ratio can be implement with a 5/4 oversampled channelizer using the disclosed invention. In some embodiments, the disclosed invention is a critically sampled channelizer design that updates its parameters (filter coefficients) to mask the spectrum gaps. The center frequency offsets are then fed into downstream application processing to account for the frequency offsets caused by updating the parameters. The center frequency of the channels are modulated or "jiggled" and therefore over time, the entire spectrum is covered with a critically sampled channelizer. In some embodiments, the disclosed invention modulates the center frequency reference in each channel and therefore the position of both the passbands and the nulls for each channel are swept along and over the frequency gaps. The invention then keeps track of the frequency offsets such that the correct frequencies are detected at the output.

Different modulations, typically referring to frequency modulating the center frequency, such as random or predictive modulations may be used to update the filter coefficients. Predictive modulations may include linear frequency modulation, non-linear frequency modulations, modulations according to a pseudo-random but known pattern, or a user defined sequence or pattern of center frequency modulations. This way, the invention reduces the processing time and power.

Figure 2:
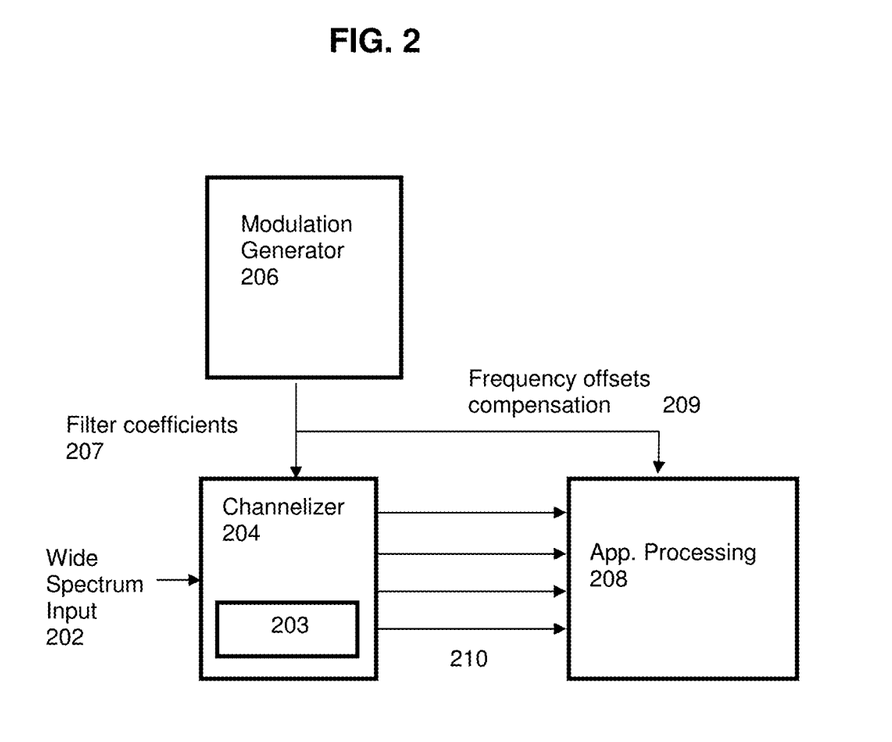
FIG. 2 illustrates an exemplary channelizer, according to some embodiments of the disclosed invention.
Figure 5:
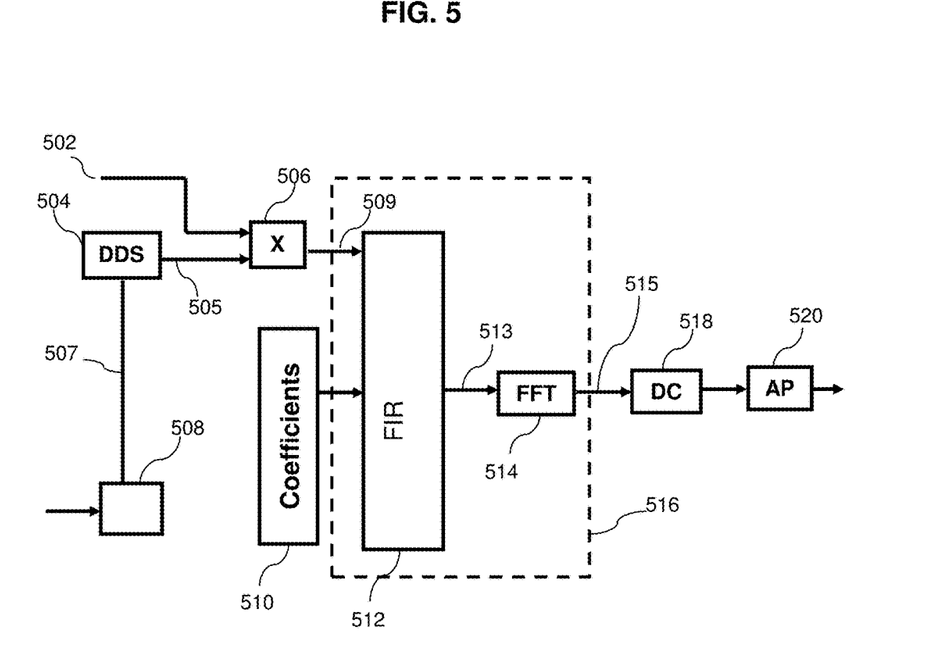
FIG. 5 is an exemplary block diagram of a frequency channelizer including a direct digital synthesizer (DDS) block for controlling the center frequencies of the channels of a channelizer, according to some embodiments of the disclosed invention.

FIG. 2 illustrates an exemplary channelizer, according to some embodiments of the disclosed invention. As shown, a channelizer 204 takes a wide spectrum signal 202 as the input, for example, via an input port. A modulation generator (modulator circuit) 206 modulates the filter coefficients 207 of the channelizing filter bank 203 in the channelizer 204, using a random or predictive modulation scheme. FIG. 5 illustrates a direct digital synthesizer (DDS) block that is used to control the center frequency of all the channels, where control words for the DDS are updated from a memory register bank. These control words are binary equivalents of the center frequencies of each channel such as 10 MHz, 20 MHz, etc.

This modulation (updating) of the filter coefficients 207 results in the samples being moved along and over the spectrum gaps (thereby masking the gaps) and therefore being capable of detection over time. The channelizer outputs 210 (four are shown in this example) may then be input to an application processing circuit 208, for example, a digital signal processor (DSP), for various applications, for example, radar, electronic warfare, communications, video processing applications and the like. For instance, the application processing circuit 208 may be performing pulse compression, Doppler processing, spectral sharing or any other types of signal processing. Processing at the application processing circuit 208 may be employed to steer decisions that determine sub-band combination at the output. The frequency offsets compensation 209 to compensate for the frequency shifts caused by the modulation are also input to the application processing circuit 208 so that it can convert the center frequencies of the channelizer outputs 210 to their original frequency and therefore recover the data.

Figure 3:
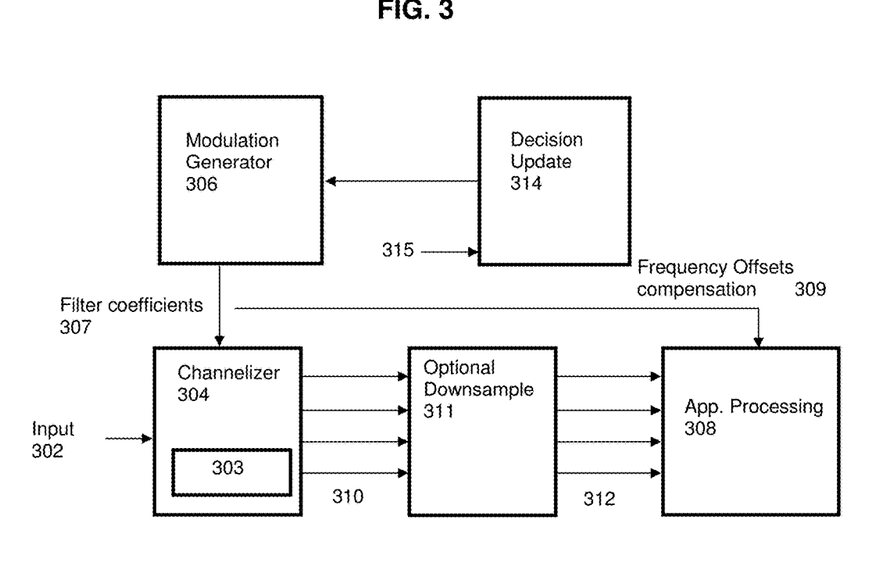
FIG. 3 depicts an exemplary frequency channelizer with a feedback loop, according to some embodiments of the disclosed invention.

FIG. 3 depicts an exemplary frequency channelizer with a feedback loop, according to some embodiments of the disclosed invention. As shown, a wide spectrum signal 302 is received by a channelizer 304 via, for example, an input port. A modulation generator (modulator circuit) 306 modulates the filter coefficients 307 of the filter bank 303, using a random or predictive modulation scheme. In these embodiments, the channelized signals may optionally be down-converted and rate-changed to a lower sampling rate to match the rates of an application processing circuit 308. For this purpose, an optional down-sampler (or a down-converter) 311 may be used at the output of the channelizer 304. The down-sampled signals may now be conveniently and efficiently processed by the application processing circuit 308.

In some embodiments, a decision update circuit 314 updates the modulation scheme of the modulation generator 306, based on the outputs of the channelizer 304, using the direct outputs 310 of the channelizer or the down-sampled outputs 312. The decision update circuit 314 decides what center frequency modulations and channel coefficients are desirable to capture all the data in the pass-band of a channel as opposed to a null between channels. The decision update circuit 314 takes feedback 315, such as the amplitude levels of signals being detected through the channelizer. In some embodiments, feedback 315 may be apriori knowledge from a user or other processing blocks (e.g., the channelizer) that is used to update the modulation generator. For example, a user may wish to update linear modulation to random modulation via the port 315.

If the amplitude of the signal in one configuration is much higher than the same signal with a, for example, 10 MHZ center frequency offset configuration, a 10 MHz offset puts the signal into a null between channels, which is undesirable. Consequently, the decision update circuit 314 selects a center frequency modulation method to maximize signal amplitude using this data. This way, the disclosed invention more effectively detects the correct frequencies despite of the spectrum gaps.

Similar to FIG. 2, channelizer's outputs 310 or 312 (if the optional down-sampler is present) are then input to the application processing circuit 308, for example, a digital signal processor (DSP), for various applications. The frequency offsets compensation 309 caused by the modulation are also input to the application processing circuit 308 so that it can convert the frequencies of the channelizer output to their original frequency and therefore recover the data. In some embodiments, the frequency offsets compensation applies the inverse offsets at the downstream processor.

FIG. 5 is an exemplary block diagram of a frequency channelizer including a direct digital synthesizer (DDS) block for controlling the center frequencies of the channels of a channelizer, according to some embodiments of the disclosed invention. As shown, the center frequency values 507 are loaded into a digital synthesizer 504, which can be constructed as a direct/discrete digital synthesizer (DDS). In some embodiments, these values are known a prior and recorded in memory so that the center frequency offsets are tracked and can be taken into account in post processing after the channelizer. In some embodiments, the post processing may include removing the frequency offset introduced by the channelizer. For example, if a 20 MHz center frequency offset was introduced by the DDS to modulate the channel center frequencies, a negative 20 MHz offset would be applied in post processing.

The digital synthesizer 504 generates a local oscillating (LO) frequency signal 505 (e.g., sinewave) according to parameters (e.g. a selected frequency) set by a control circuit 508. In some embodiments, the control circuit 508 includes a processor, memory (e.g., RAM and ROM) and I/O circuitry. The LO frequency signal 505 is utilized to actively tune a center of frequency of a selected channel of a channelizer 516. A signal mixer 506 mixes the LO frequency signal 505 with an RF input signal 502 to generate a mixed output signal 509 having a shifted frequency with respect to the frequency of the RF input signal 502. The input signal 502 can be received as a real value or a complex value including a real component (I) and an imaginary component (Q). The shifted frequency set by the mixed output signal 509 allows for selecting a center frequency of a selected channel of the channelizer 516. In the mixing operation, a local oscillator source (e.g., the DDS in this case) is modulated with the IQ input signal. In some embodiments, the mixing operation is simply a digital multiply operation.

The channelizer 516 is in signal communication with the mixer 506 and the coefficient input module 510. The mixer 506 delivers the mixed output signal 509 to the channelizer 516. The coefficient input module 510 outputs one or more coefficient parameters, which can modify a characteristic of one or more complex RF channels input to the channelizer 516. The characteristics include, but are not limited to, a selected center frequency, a selected non-zero frequency and a gain. For example, the coefficient parameters can be digitally set to create a bandpass filter for passing a signal at a certain non-zero frequency, to select a center frequency value, etc., as known in the art. In some embodiments, the coefficients are modulated by retrieving digital values from a RAM (e.g., within the control circuit 508) on a particular clock cycle. This is done every clock cycle so that the coefficients are continuously modulated. Accordingly, the coefficients are updated from a predefined sequence or dynamically from a feedback path that is determined based on what inputs are processed. This way, the modulated coefficients can dynamically sweep the center frequencies of the channels to detect the input signal 502 in the channelized spectrum.

The channelizer 506 includes an adaptive filter 512, and one or more Fourier transfer modules 514. The adaptive filter 512 is an adaptive (i.e., tunable) polyphase decimating finite impulse response (FIR) filter array. The adaptive filter 512 processes one or more input signals delivered from the mixer 506, such as a complex RF input signal (I, Q), for example, and generates one or more filtered output RF signals. As known in the art, the adaptive filter 512 may operate as a bandpass filter, high-pass filter, or a low-pass filter, as needed, so as to independently adapt (i.e., tune) an individual channel.

The Fourier transform module 512 receives one or more complex RF output channels 513 from the adaptive filter 512. The channels input to the Fourier transform module are simultaneously represented as a filtered "polyphased" response. Based on the complex RF channels 513, the Fourier transform module generates a number of real value output signals, or output channels 515. Following output from the Fourier transform module, the channels 515 are centered, or are output at baseband. An optional down converter circuit 518 down-converts the output channels 515 from the Fourier transform module 514 to receive the real value output signals 515, that is, the baseband channel signals 515.

In some embodiments, channelizer 512 may include a mode selector module (not shown) that receives a mode select signal (e.g., input by a user) which indicates a selected operating mode of the channelizer from among a plurality of different operating modes. The selected mode of the channelizer can be automatically selected based on the characteristics of the mixed output signal 509 or can be manually selected. The available operating modes indicated by the mode-select signal include, for example, a radar mode, an electronic warfare (EW) mode, communications mode.

When operating in the radar mode or the communications mode, for example, the channelizer performs digital down conversion (DDC) to decimate mixed signal 509 to a lower bandwidth. When operating in the EW mode, for example, the channelizer 516 operates to decimate sub-bands of the mixed signal 509 and output a full spectrum coverage of the full spectrum of the input signal, or a subset of the full spectrum. In response to the mode select signal, the mode selector module outputs a mode command signal that commands the adaptive filter 512 to operate according to the mode indicated by the mode select signal. For example, in response to invoking the channelizer mode, the adaptive filter 512 utilizes the coefficient parameters to generate a plurality of individual complex RF channels 513.

When invoking the DDC mode, the adaptive filter 512 generates a parallelization of a selected individual channel. In some embodiments, the parallelization signal processing operation can be defined as polyphasing the representation of a selected channel among a plurality of input channels. Accordingly, when operating in the DDC mode, the channelizer 516 can adjust the center frequency (and the gain) of an individual complex RF channel 513 based on the coefficient parameters and/or the mixed output signal 509 to change the center frequency of an individual complex RF channel 513.

The output of the Fourier transform module 514 or the optional down converter circuit 518 are then input to an application processing circuit 520 to further process the signals, such as, pulse compression, Doppler processing, spectral sharing or any other types of signal processing. The application processing circuit 520 also compensate for the frequency shifts caused by the modulation to convert the center frequencies to their original frequency and therefore recover the data. In some embodiments, the feedback is determined by the IQ processing of the amplitude and phase responses. In some embodiments, digital logic/circuit is used to compare the amplitude and phase values to a threshold. This logic drives a multiplexor to pass the channels, when energy is detected, onto the deeper stages of the processing or updates the coefficients (stored in a RAM). In some embodiments, a machine learning routine may be utilized to process and optimize the (dynamic) modulation of the filter coefficient.

Figure 6:
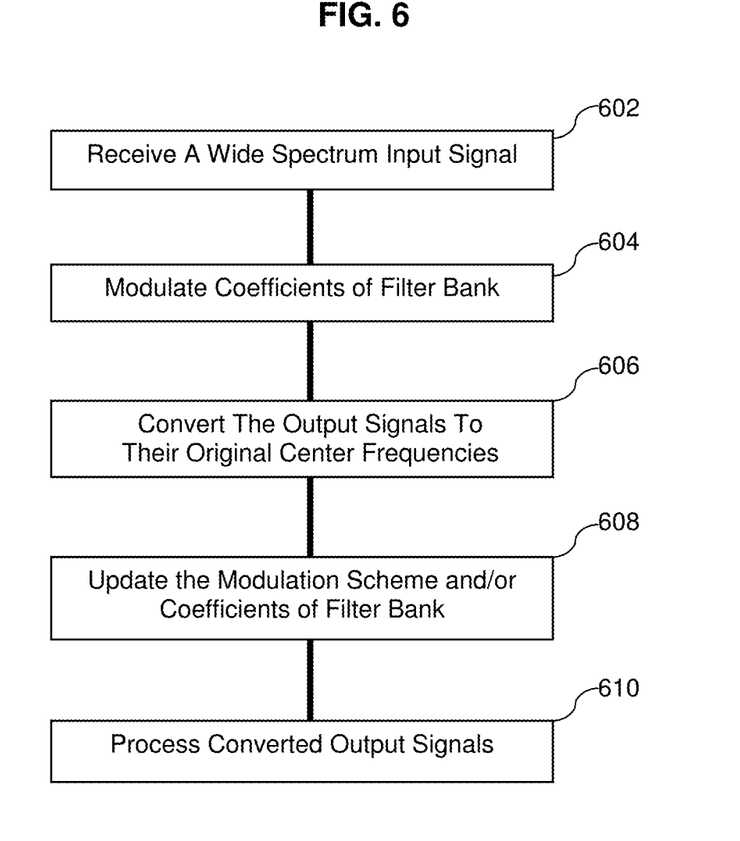
FIG. 6 is an exemplary process flow for modulating filter coefficients in a channelizer, according to some embodiments of the disclosed invention.

FIG. 6 is an exemplary process flow for modulating filter coefficients (parameters) in a channelizer, according to some embodiments of the disclosed invention. Referring to the exemplary embodiments of FIGS. 2 and 3, and as shown in block 602, a wide spectrum input signal 202, 302 is received by a frequency channelizer 204, 304. In block 604, filter coefficients 207, 307 of a filter bank 203, 303 within the frequency channelizer 204, 304 is modulated by a modulation generator 206, 306 to sweep a center frequency of each channel of the frequency channelizer 204, 304, using a modulation scheme. The modulation scheme may be a random modulation, a linear frequency modulation, a non-linear frequency modulations, a modulation according to a pseudo-random but known pattern, or a user defined pattern of frequency modulations. In block 606, the output signals 210, 310 of the frequency channelizer 204, 304 are converted by an application processing circuit 208, 308 to their original center frequencies, based on the frequency offsets compensations 209, 309 caused by the modulation.

In the optional block 608, the modulation scheme and/or the filter coefficients 207, 307 may be dynamically updated by a decision update circuit 314 based on feedback 315 from the signals detected (or missed) at the output of the frequency channelizer 204, 304. The updated modulation scheme and/or filter coefficients 207, 307 are directed back to the modulation generator 206, 306. In block 610, the converted outputs of the application processing unit 208, 308 may be processed for various applications, such as pulse compression, Doppler processing, and/or spectral sharing. The applications may include radar applications, electronic warfare applications, communications applications, and video processing applications and the like. As described above, with respect to FIG. 3, the channelized signals may optionally be down converted by a down-sampler 311 and rate-changed to a lower sampling rate to match the rates of the application processing circuit 208, 308.

Figure 4:
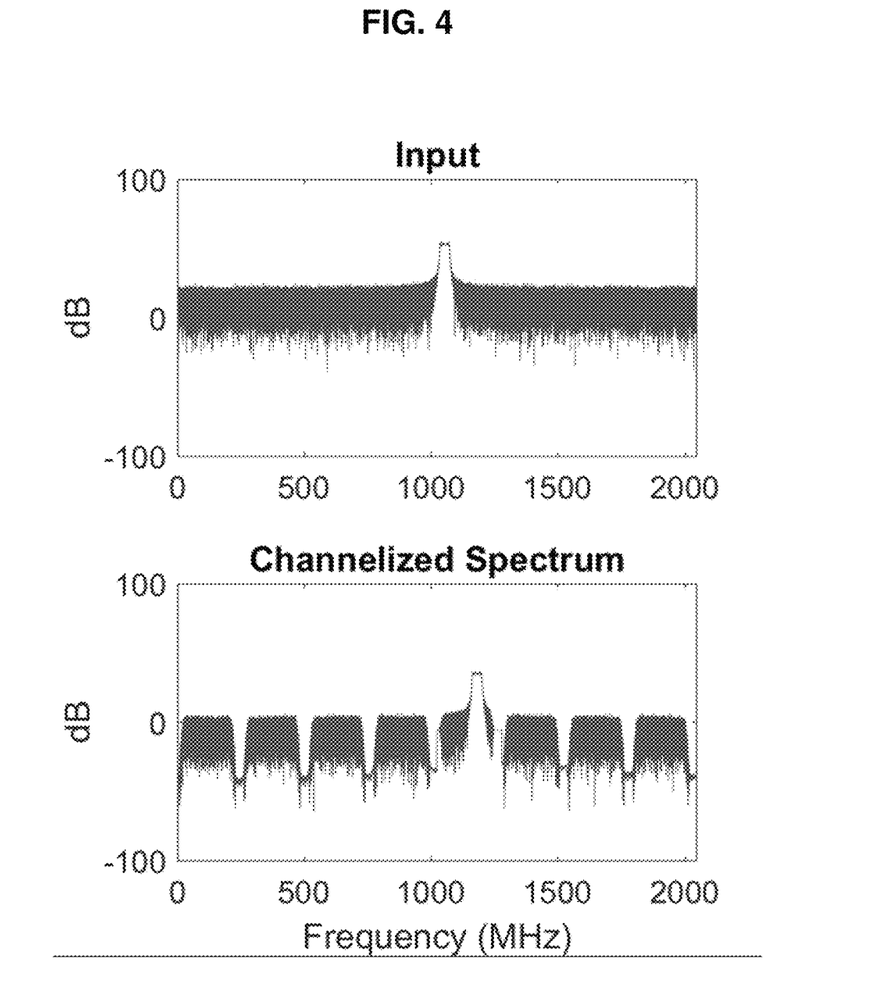
FIG. 4 illustrates a frequency graph for an input signal and the channelized spectrum, according to some embodiments of the disclosed invention.

FIG. 4 illustrates a frequency graph for an input signal and the channelized spectrum, according to some embodiments of the disclosed invention. As shown, the input signal (top graph) has a center frequency around 1 GHz. The channelized spectrum also shows the input signal with a (slight) offset. Since the filter coefficients are being modulated, the channelized spectrum, including its gaps, sweeps across the center frequency and over time, detects the input signal in the channelized spectrum. As illustrated, the nulls or gaps in the spectrum that the channelizer measures occur at regular intervals between the channels. The passband of the channel is typically at least as large as the gaps, and also occurs at regular intervals.

In some embodiments, the coefficients are modified in two ways. First, the filter coefficients of the FIR filter (e.g., 512a in FIG. 5) can be modified to make the passband of the channels wider and the nulls narrower. In some embodiments, the filter coefficients are preloaded into a RAM of the control circuit 508 and retrieved by the control circuit 508. In some embodiments, the coefficients are calculated on the fly. The center frequency coefficients of the DDS are also modified to shift the passband of the channels over to the frequency spectrums of where the nulls used to be with the prior set of center frequency coefficients. In this way, a signal that used to fall in a null, would fall into the passband with the new set of coefficients 9 as shown in the lower graph) and thus can be measured appropriately in the passband.

It will be recognized by those skilled in the related fields that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method for modulating filter coefficients of a frequency channelizer including a filter bank, the method comprising:
   receiving a wide spectrum input signal;
   modulating the filter coefficients of the filter bank to sweep a center frequency of each channel of the frequency channelizer, using a modulation scheme; and
   inputting frequency offset compensation caused by the modulation, and output signals of the frequency channelizer to an application processing circuit to convert the output signals to their original center frequencies, wherein the modulation scheme is a linear frequency modulation, a non-linear frequency modulations, a modulation according to a pseudo-random but known pattern, or a user defined sequence.

2. The method of claim 1, further comprising updating the modulation scheme, based on the output signals of the frequency channelizer.

3. The method of claim 2, further comprising selecting the filter coefficients of the filter bank, based on the output signals of the frequency channelizer.

4. The method of claim 2, wherein updating the modulation scheme is based on amplitude levels of the signals being detected at the output of the frequency channelizer.

5. The method of claim 3, wherein selecting the filter coefficients of the filter bank is based on amplitude levels of the output signals being detected at the output of the frequency channelizer.

6. The method of claim 1, further comprising down-sampling the output signals of the frequency channelizer before inputting to the application processing circuit.

7. The method of claim 1, further comprising processing the converted output signals for one or more of radar applications, electronic warfare applications, communications applications, and video processing applications.

8. The method of claim 1, further comprising performing one or more of pulse compression, Doppler processing, and spectral sharing on the converted output signals.

9. The method of claim 1, wherein the modulation scheme is a random modulation.

10. A circuit for modulating filter coefficients of a frequency channelizer including a filter bank comprising:
an input port for receiving a wide spectrum input signal;
a modulation generation circuit for modulating the filter coefficients of the filter bank to sweep a center frequency of each channel of the frequency channelizer, using a modulation scheme;
an application processing circuit for converting output signals of the frequency channelizer to their original center frequencies responsive to frequency offset compensation caused by the modulation generation circuit; and
a down-sampler for downs-sampling the output signals of the frequency channelizer before being input to the application processing circuit.

11. The circuit of claim 10, further comprising a decision update circuit for updating the modulation scheme and selecting the filter coefficients of the filter bank, based on the output signals of the frequency channelizer.

12. The circuit of claim 11, wherein the decision update circuit updates the modulation scheme and selects the filter coefficients based on amplitude levels of the signals being detected at the output of the frequency channelizer.

13. The circuit of claim 10, wherein the application processing circuit processes the converted output signals for one or more of radar applications, electronic warfare applications, communications applications, and video processing applications.

14. The circuit of claim 10, wherein the application processing circuit performs one or more of pulse compression, Doppler processing, and spectral sharing on the converted output signals.

15. The circuit of claim 10, further comprising a decision update circuit for updating the modulation scheme and selecting the filter coefficients of the filter bank, based on the output signals of each channel of the frequency channelizer.

16. A frequency channelizer comprising:
an input port for receiving a wide spectrum input signal;
a filter bank including a plurality of filter coefficients;
a modulation generation circuit for modulating the filter coefficients of the filter bank to sweep a center frequency of each channel of the frequency channelizer, using a modulation scheme;
an application processing circuit for converting output signals of each channel of the frequency channelizer to their original center frequencies responsive to frequency offset compensations caused by the modulation generation circuit; and
a decision update circuit for updating the modulation scheme and selecting the filter coefficients of the filter bank, based on the output signals of each channel of the frequency channelizer.

17. The frequency channelizer of claim 16, wherein the modulation scheme is a linear frequency modulation, a non-linear frequency modulations, a modulation according to a pseudo-random but known pattern, or a user defined sequence.

18. The frequency channelizer of claim 16, further comprising a down-sampler for downs-sampling the output signals of the frequency channelizer before being input to the application processing circuit.

19. The frequency channelizer of claim 16, wherein the decision update circuit updates the modulation scheme and selects the filter coefficients based on amplitude levels of the signals being detected at the output of the frequency channelizer.

20. The frequency channelizer of claim 16, wherein the application processing circuit processes the converted output signals for one or more of radar applications, electronic warfare applications, communications applications, and video processing applications.

* * * * *